United States Patent
Pepper et al.

(10) Patent No.: US 7,215,696 B2
(45) Date of Patent: May 8, 2007

(54) ELECTRICALLY PUMPED SEMICONDUCTOR ACTIVE MIRROR WITH IMPROVED PERFORMANCE AND REDUCED PARASITICS

(75) Inventors: David M. Pepper, Malibu, CA (US); David S. Sumida, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 438 days.

(21) Appl. No.: 10/774,001

(22) Filed: Feb. 6, 2004

(65) Prior Publication Data

US 2005/0175056 A1    Aug. 11, 2005

(51) Int. Cl.
*H01S 3/14* (2006.01)
*H01S 3/20* (2006.01)

(52) U.S. Cl. .............................. 372/68; 372/39; 372/54

(58) Field of Classification Search ................ 372/54, 372/68
See application file for complete search history.

(56) References Cited

U.S. PATENT DOCUMENTS

| | | | |
|---|---|---|---|
| 3,786,368 A | 1/1974 | Bjorkholm et al. | 331/94.5 |
| 3,838,359 A * | 9/1974 | Hakki et al. | 372/45.01 |
| 3,970,960 A | 7/1976 | Mollenauer | 331/94.5 F |
| 3,992,681 A | 11/1976 | Haun, Jr. et al. | 331/94.5 M |
| 4,249,141 A | 2/1981 | Brown et al. | 331/94.5 F |
| 4,757,268 A | 7/1988 | Abrams et al. | 330/4.3 |
| 5,754,572 A | 5/1998 | Pinto et al. | 372/20 |
| 5,926,494 A * | 7/1999 | Pepper | 372/70 |

OTHER PUBLICATIONS

U.S. Appl. No. 10/774,002, filed Feb. 6, 2004, Sumida et al.
Gisen, A., et al., "Scalable Concept for Diode-Pumped High Power Solid-State Lasers," *Applied Physics B 58*, Springer-Verlag, pp. 365-372 (1994).
Le, H.Q., et al., "Scalable High-Power Optically Pumped GaAs Laser," *Appl. Phys. Lett.*, vol. 58, No. 18, pp. 1967-1969 (1991).
"VCSELS," *Optics & Photonics News*, pp. 45-47 (Mar. 2002).
Wagner, J.W., et al., "Theoretical Noise-Limited Sensitivity of Classical Interferometry," *J. Opt. Soc. Am. B*, vol. 4, No. 8, pp. 1316-1326 (Aug. 1987).
Zhang, L., et al., "Characterization of Ion Implanted Wageguides in Nd:YAG," *J. Appl. Phys.*, vol. 69, No. 6, pp. 3440-3446 (Mar. 15, 1991).

* cited by examiner

*Primary Examiner*—Armando Rodriguez
(74) *Attorney, Agent, or Firm*—Ladas & Parry LLP

(57) ABSTRACT

A system and a method for providing more gain while minimizing the potential for parasitic oscillation and amplified spontaneous emissions in an electrically pumped optical amplifier or laser system, utilizing a partitioned monolithic gain element. The monolithic gain element being partitioned into discontinuous amplifying gain regions such that parasitic modes and amplified spontaneous emissions are substantially obviated.

28 Claims, 5 Drawing Sheets

ELECTRICALLY PUMPED SEMICONDUCTOR ACTIVE MIRROR WITH IMPROVED PERFORMANCE AND REDUCED PARASITICS

CROSS REFERENCE TO RELATED INVENTIONS

This application is related to the disclosure of U.S. Pat. No. 5,926,494 to Pepper, which is hereby incorporated by reference.

This application is also related to the disclosure of U.S. patent application Ser. No. 10/774,002 filed on the same date as this application by Sumida and Pepper entitled "Optically Pumped Active Mirror with Improved Performance and Reduced Parasitics," which is hereby incorporated by reference.

TECHNICAL FIELD

This present invention relates to the optimization of optical systems that use active mirrors, specifically covering techniques to minimize the potential of parasitic oscillation modes and Amplified Spontaneous Emission (ASE) losses thereby enabling energy or power scaling of active mirror optical amplifiers and lasers.

BACKGROUND OF THE INVENTION

Parasitic oscillation modes and Amplified Spontaneous Emission (ASE) losses limit the choices designers have in designing highly optimized optical systems. For example, in high-power welders and in many other industrial and military laser applications, the desire is for an optical output with high gain and/or a great amount of power. However, the state-of-the-art optical systems used in these applications have a high potential for parasitic modes and ASE loss, thus requiring design tradeoffs and use of less efficient optical sources.

A basic optical system in which this invention may be used includes a single element or an ensemble of gain element(s), called active mirrors, and a set of electrical or optical pumping sources. This system may be configured as an oscillator or as a Master Oscillator Power Amplifier (MOPA).

Active mirrors are typically comprised of a thin layer of material that can experience optical gain (i.e. a layer of Nd:YAG, Yb:YAG, or a semiconductor material such as GaAs, in the form of a quantum well or quantum cascade architecture, etc.), which is deposited onto a thin substrate. A highly reflective layer is typically placed in between the active region and the substrate. In general, an optical beam to be amplified impinges this structure, is amplified as it passes through the amplifying layer, reflects from the internal thin reflective layer, and is amplified again as it re-passes through the amplifying layer before emerging from the structure. The active layer can be pumped either optically or electrically.

This patent is directed to electrically pumped structures. For optically pumped structures, please see the patent application that is referred to above. In general, the transverse active region of these active mirrors is limited in scale size due to undesirable parasitic modes that can deplete the stored optical energy (or gain); therefore, they compete for available optical gain with the desired lasing mode that is in a direction approximately orthogonal to the transverse dimension. An example of a parasitic mode is an optical beam that propagates, or traverses, in the plane of the active mirror, thereby depleting the optical stored energy.

Conventional laser systems use several approaches to limit or circumvent parasitics and ASE loss mechanisms. One approach involves limiting the physical size of the gain medium, or the transverse spatial extent of the uniform pump beam. The article "Scalable Concept For Diode-Pumped High-Power Solid-State Lasers", by A. Giesen et al., published in *Applied Physics* B 58, 365–372, Springer-Verlag (1994), describes a quasi-three-level laser gain media element that employs thin disk stages attached to coolers. In this application, the size of the surface area of the disk has to be limited due to parasitics, while the thickness is limited by thermal considerations. These limitations in size dictate a reduction in the size of the usable surface area of the gain medium, which results in a lower number of the usable pump photons. See also "Scalable High Power Optically Pumped GaAs Laser", by Le, Di Cecca and Mooadian, published in *Applied Physics Lett.*, Vol. 58, No. 18, 1967–1969, American Institute of Physics (1991). The technology disclosed thereby avoids the limitation of the physical size of the gain medium by partitioning the gain medium.

A second approach for circumventing undesirable transverse losses involves physically sectioning or otherwise modifying a large-size gain medium into a number of smaller discrete gain cells, as is described in U.S. Pat. No. 4,757,268 issued in 1988 to Abrams et al. As an example of physically sectioning a large-size gain medium into a number of smaller discrete gain cells, a large transverse area gain medium, such as Nd:YAG, is longitudinally sectioned or sliced into a number of small segments. In addition, loss elements (e.g. absorbing slabs) may be placed between the gain medium elements to avoid transverse parasitics of the package. Further, this technique also requires coherent combining of the discrete amplifying stages to realize optimal far-field performance, which is usually accomplished via adaptive optics or via nonlinear optical phase conjugation. Unlike this second approach, the invention disclosed herein can be realized using a monolithic structure, as opposed to the discrete gain elements. This results in high optical quality across the active mirror, and, since the entire structure is formed on a common substrate, the need to coherently combine the discrete amplifying states can be avoided.

In a third approach to reducing ASE and parasitic oscillation modes, a large-area wafer with a Multiple Quantum Well (MQW) epilayer, serving as the gain medium, is processed during growth to generate discrete gain regions that can yield gain under optical pumping, while other regions cannot, even in the presence of the pump beams. However, this procedure requires additional processing steps during epilayer growth, which adds cost and complexity to the system, while the invention disclosed herein utilizes conventional photolithographic processing techniques. See U.S. Pat. No. 4,249,141, "Laser Systems Using Pentaphosphate Active Mediums", D. C. Brown, J. Wilson, and assigned to University of Rochester.

A fourth approach for addressing the ASE problem is to employ "optical partitioning" of a single large-area active medium by using an optical pump source with a mask, or other diffractive element, to realize fragmented gain regions, as described in U.S. Pat. No. 5,926,494 issued in 1999 to Pepper. The invention disclosed herein does not require the additional optical elements to map a single large-area optical beam into a prescribed optical pattern for the partitioned pumping, and is not restricted to optically pumped devices.

The present invention involves manufacturing of the active layer of the active mirror directly into desired fragmented regions, avoiding the need for complex optical imaging techniques, along with precise registration and relay components. Thus, the system can be employed with gain elements that are electrically pumped, such as semiconductor elements, quantum wells, and quantum cascade structures, etc., in addition to optically pumped gain media. Since the structure is fabricated on a common element, using conventional lithographic techniques, a large-scale, monolithic device can be realized with high optical quality across the entire device. The device can be easily mounted on thermoelectric coolers or other heat sinks, if needed.

The prior art also includes:

(1) U.S. Pat. No. 4,757,268, "Energy Scalable Laser Amplifier", by Abrams, et al., assigned to Hughes Aircraft Company. While this patent describes an array of individual laser gain elements, it does not suggest a monolithic structure.

(2) U.S. Pat. No. 5,926,494, "Laser Systems with Improved Performance and Reduced Parasitics and Method", by D. M. Pepper, assigned to Hughes Electronics Corporation. This patent describes a method of reducing the parasitics via a spatially inhomogeneous optical pump beam, but does not suggest a physical change in the gain medium.

(3) A. Giesen et al., "Scalable Concept For Diode-Pumped High-Power Solid-State Lasers", *Applied Physics B* 58, pp. 365–372, Springer-Verlag (1994). This reference describes a quasi-three-level laser gain media element which employs thin disk stages attached to coolers, which must be limited in surface area due to parasitics.

(4) Le, Di Cecca and Mooadian, "Scalable High Power Optically Pumped GaAs Laser", *Applied Physics Lett.*, Vol 58, No. 18, 1967–1969, American Institute of Physics (1991). This discussion also limits the surface area of the gain medium due to parasitics.

BRIEF DESCRIPTION OF THE INVENTION

In one aspect, the present invention provides a gain medium comprising: a substrate; a reflecting layer deposited onto said substrate; and a thin layer of material that can experience optical gain partitioned into discontinuous amplifying gain regions deposited onto said reflecting layer.

In another aspect, the present invention provides a method of minimizing the potential for parasitic oscillation modes and amplified spontaneous emissions, comprising the following steps: fabricating a monolithic gain element; and partitioning said monolithic gain element into discontinuous amplifying gain regions such that parasitic modes and amplified spontaneous emissions are substantially obviated.

In yet another aspect, the present invention provides a laser system, comprising: an input signal beam; at least one pumping source; and at least one monolithic gain medium element having a plane and a normal to the plane, said at least one monolithic gain medium being partitioned into discontinuous amplifying gain regions in order to amplify said input signal beam to produce an amplified output signal beam.

In yet another aspect, the present invention provides a laser system comprising: an input signal beam; at least one pumping source; a plurality of monolithic gain medium elements fabricated to provide a lossy configuration to minimize modes of operation that are substantially lateral to the normal of the plane, while maintaining a high-gain path for a mode of operation that is substantially on-axis to the normal of the plane; and a plurality of amplifier stages comprising a subsequent amplifier stage, each of the amplifier stages comprising said plurality of monolithic gain medium elements, the subsequent amplifier stage comprising at least one second said monolithic gain medium element, said plurality of monolithic gain medium elements each having a plane and a normal to the plane, and each of said plurality of monolithic gain medium elements being adapted to receive the input signal beam and being partitioned into discontinuous amplifying gain regions in order to amplify said input signal beam to produce the amplified output signal beam.

In yet another aspect, the present invention provides a method of increasing gain while minimizing parasitic oscillation modes and amplified spontaneous emission, comprising the following steps: providing a monolithic gain element; partitioning active layer of said monolithic gain element into discrete gain regions and loss regions, the combination of discrete gain regions representing a combined transverse area that can provide a combined gain that is greater than a single gain provided by a single gain region having a single transverse area that is substantially equal in size to the combined transverse area; inputting into the gain medium element an input signal; and providing a high gain-path for the desirable longitudinal mode and at the same time limiting undesirable lateral modes of said input signal.

In yet another aspect, the present invention provides a laser system optimized to produce maximum gain and to minimize the potential for parasitic oscillation modes and amplified spontaneous emission, the laser system comprising: an input signal beam; an amplified output signal beam; a pump beam; and a monolithic gain medium element for receiving the input signal beam, the gain medium comprising a plurality of discrete gain regions and loss regions, the combination of discrete gain regions representing a combined transverse area that can provide a combined gain that is greater than a single gain provided by a single gain region having a single transverse area that is equal in size to the combined transverse area.

DETAILED DESCRIPTION OF A PREFERRED EMBODIMENT

Figure 1:
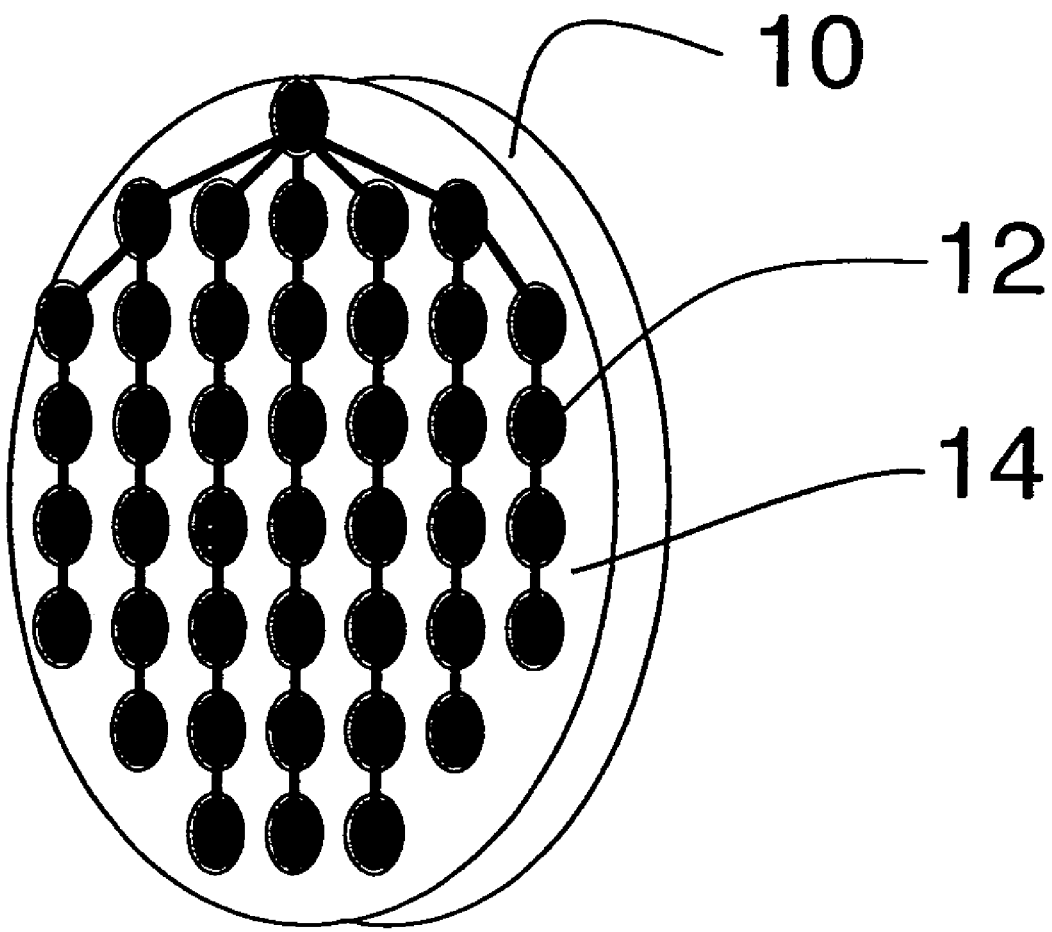
FIG. 1 is a cross-sectional view of a monolithic semiconductor gain medium element, including regions of high gain and regions of loss, used in electrical pumping systems.

FIG. 1 depicts a monolithic electrically pumped gain medium element 10 having a plurality gain regions 12 disposed in a loss region 14. The loss region 14 provides isolation that effectively prevents occurrence of ASE loss, after multiple passes through the gain medium element 10. There are a variety of techniques that can be used to fabricate this partitioned monolithic gain medium element, and the preferred choice will be a function of the host and gain medium materials that comprise the active mirror, the specified output power and energy of the system, thermal properties of the elements, the manner in which the system is pumped to realize the optical gain, etc. Independent of the partitioning method of the monolithic gain medium 10, the fill factor, the fractional area of the overall structure that is active versus that which is passive or lossy, can be maximized so that the active mirror is optimally utilized. This fill factor is a function of the ratio of the gain-length product in the gain regions 12 to that of the corresponding optical extinction-length product in the loss region 14. Since these systems all involve scale sizes of many optical wavelengths, conventional photolithographic processing techniques can be employed in the fabrication of the monolithic gain medium 10, as well as in the scaling of the monolithic gain medium 10 to higher powers and energies.

Figure 2:
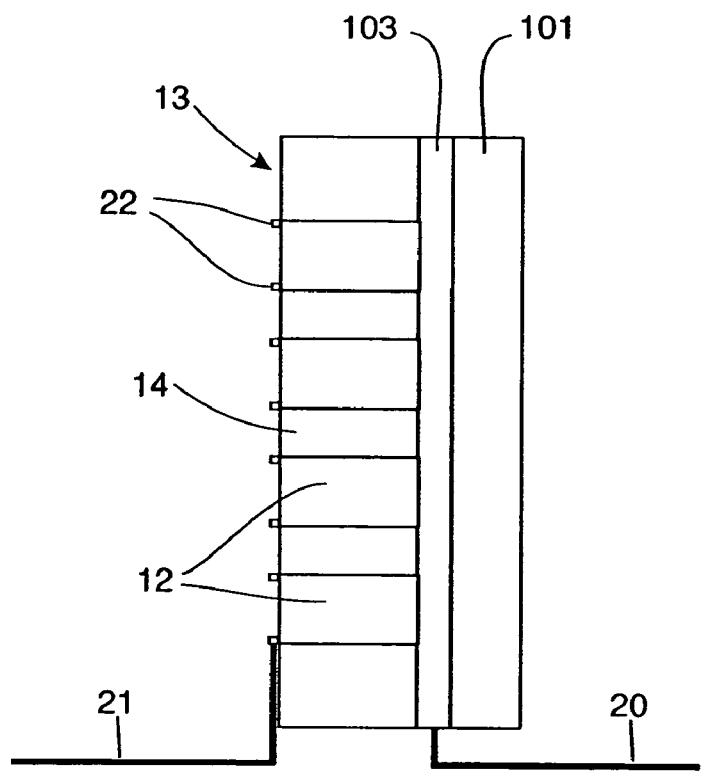
FIG. 2 depicts a cross-sectional view of a monolithic gain element used in electrical pumping systems.

FIG. 2 depicts an injection pumped system, where the gain regions 12 can be partitioned via electrically pumping the active mirror in well-defined regions 12 via an array of injection-current pads as shown in FIG. 1. In this case, current injection is localized to spatial regions 12 across the surface of the active mirror, whereas, regions 14 without injection typically absorb the light and thus would act as the lossy barriers that partition the active regions 12. Electrical connections 20, 21 provide electrical current to the active regions 12.

Figure 3:
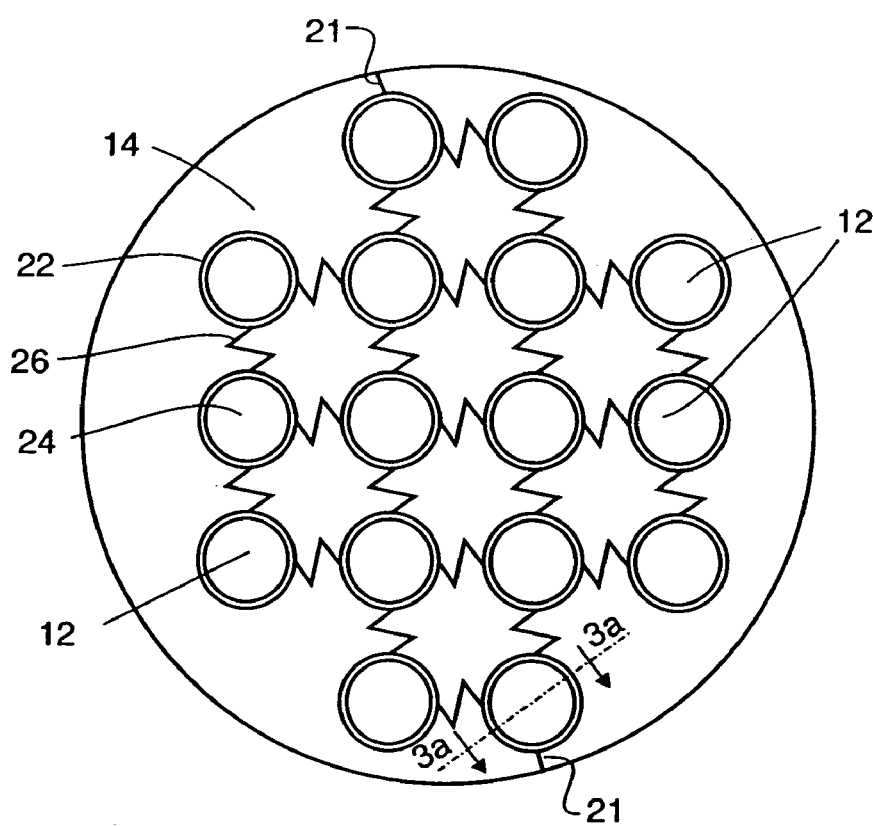
FIG. 3 is a plan view of another embodiment of a monolithic gain element.
Figure 3A:
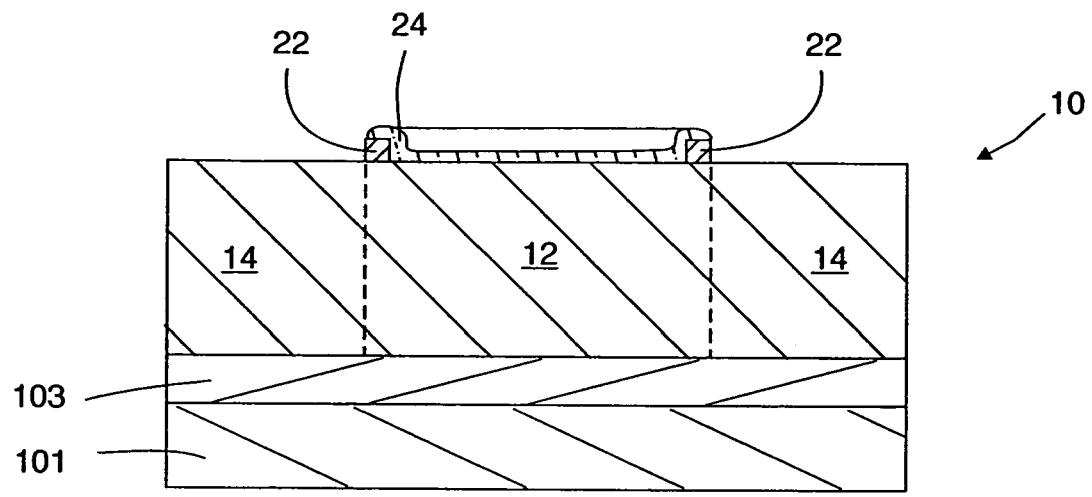
FIG. 3a shows one embodiment of a section view through one of the gain regions.
Figure 3B:
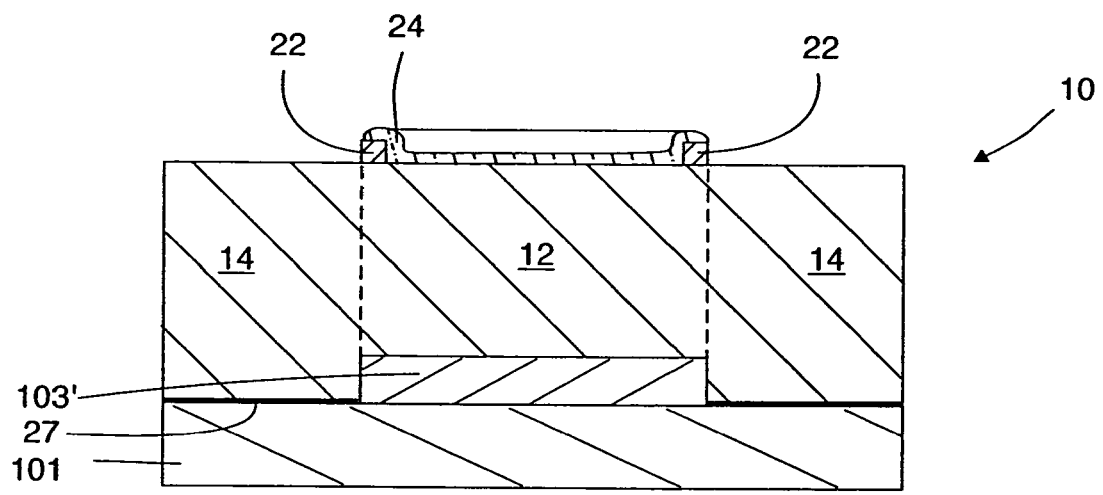
FIG. 3b is also a section view through one of the gain regions, showing an alternate construction of the back, reflective plane.

The gain medium 10 comprises a substrate 101, an electrically conductive and optically reflective layer 103 (or electrically conductive and optically reflective disks 103'— see FIG. 3b), and a plurality of gain regions 12 and lossy/passive regions 14. The gain regions 12 are preferably formed by selectively doping spatial regions 12 in a thin active layer preferably in order that the electrodes 22 may make ohmic contact with thin active layer and in order the layer 103 or disks 103' may likewise make ohmic contact with the gain regions 12. The thin active layer may comprise GaAs or other lasing materials well known to those skilled in the art.

The gain regions 12 define segmented portions in the surface 13 that experience gain when electrically pumped. In between these doped regions 12, there are one or more passive or optically lossy region(s) 14 that do not posses the aforementioned dopant(s) or posses different dopant(s), and, therefore, do not experience optical gain in the presence of the electrical pump. In the case of a three-level energy system, these passive/lossy region(s) 14 can represent an optical loss, so that any laterally propagating optical beam would never get above the parasitic threshold. This follows since the net gain across the surface (including both gain 12 and passive/lossy regions 14) can be designed to be below the ASE limit.

The doping used to form the ohmic contacts for electrodes 22 effectively means that regions 12 and 14 are preferably differentially doped (using conventional semiconductor fabrication techniques) which also helps to confine the electric fields produced by connections electrodes 22, 103, 103' in the gain regions 12.

FIG. 3 is a plan view of one embodiment of a monolithic gain element and FIG. 3a shows one embodiment of a section view through one of the gain regions 12 with one construction of the back, reflective plane 103. FIG. 3b depicts an alternate construction of the back, reflective plane 103.

In the embodiment of FIG. 3 annular conductive rings 22 are formed on the gain medium 10 in order to define the gain regions 12, which are located within the annular regions so formed. The conductive rings 22 are all connected together (in common) by means of interconnecting conducting members 26 also formed on the gain medium 10. The interconnecting conducting members 26 preferably follow a serpentine path between adjacent gain regions 12 to inhibit the formation of linear channels in the gain medium 10 connecting the gain regions 12, since such linear channels would cause undesirable lateral ASE modes to erupt. By causing the interconnecting conducting members 26 to preferably follow a serpentine path between adjacent gain regions 12, the gain regions 12 will keep the optical isolation that is desired to reduce ASE.

Furthermore, the passive/lossy region(s) 14 can be doped to inhibit gain, optically damaged, such as by using an intense laser beam focused in those regions, to inhibit gain and/or can be subjected to ion implantation to inhibit gain.

In FIGS. 3a and 3b, these section view show a single gain region 12, the desired extent of which is shown by the dashed lines. The extent of the gain regions 12 is controlled by the electric fields produced between the annular rings and the conductive back plane 103. These fields can be constrained not only by the aforementioned differential doping, but also by (i) the addition of an optically transparent, but electrically conductive cover 24 over each gain regions and/or (ii) segmenting the conductive back plane 103 into a set of disks 103' having the same diameters as the annular rings 22 and being centered therewith.

If a set of disks 103' are utilized, then they need to be interconnected and a preferred way of interconnecting them would be to use the interconnecting conducting members 27 preferably follow a serpentine path between adjacent gain regions 12, the serpentine path of the conducting members 27 preferably taking a reciprocal path to that of conducting members 26 on the top surface, again to inhibit gain in the passive/lossy regions(s) 14.

The annular rings 22 and the gain regions 12 are all depicted as being circular in the figures; however, it is not required that they be circular as any convenient geometric pattern should work. Also, the annular rings 22 are all depicted as being closed rings; however, the annular rings need not define complete rings (or other geometric shapes), but they should each encompass a substantial portion of the underlying gain region 12. The term "annular-like" is used in the claims to embrace the concept that the annular rings need not necessarily be either circular or form complete rings.

The passive/lossy region 14 is apt to be absorptive of light at the wavelength of the incident light to be amplified. The gain regions 12 preferably do not absorb much light. The absorption in region 14 will cause localized heating in region 14 and therefore the electrically pumped embodiments shown and described in this application should be less tightly packed compared to the optically pumped embodiments shown and described in the related application mentioned above in order to help dissipate that heat.

Figure 4:
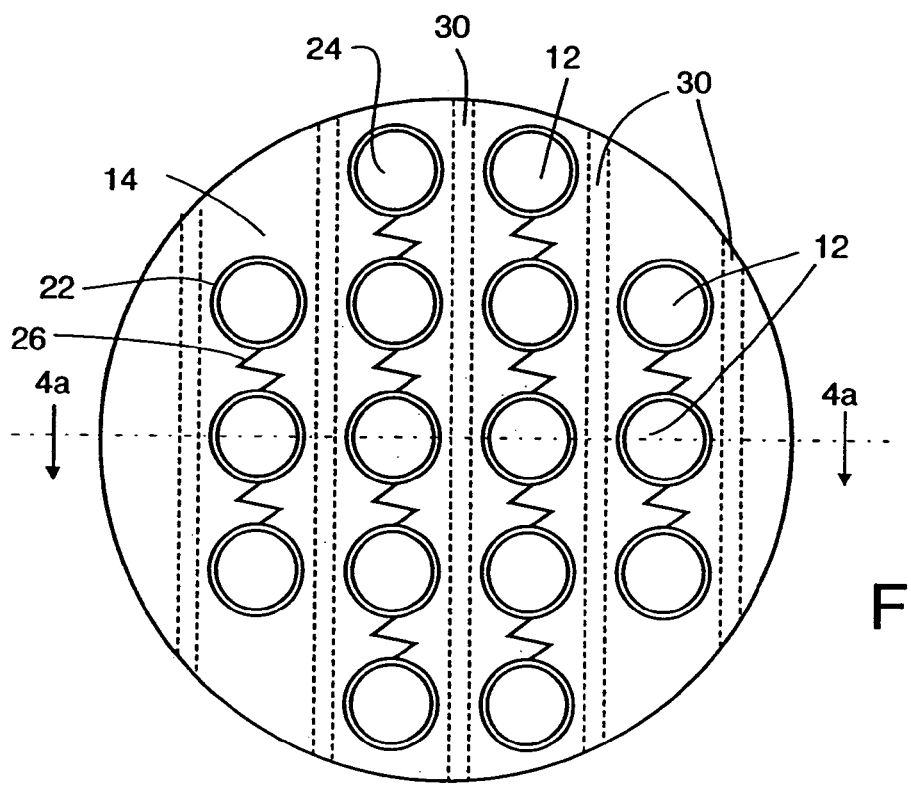
FIG. 4 is a plan view of an embodiment of a monolithic gain element with cooling channels.

In order to remove the heat generated in the passive/lossy region 14, cooling channels 30 can be provided therein by etching in order to conduct heat away using a suitable pumped cooling fluid that is pumped through channels 30. See FIGS. 4 and 4a. The cooling fluid may be a suitable liquid or gas. The cooling channels 30 are formed, for example, by etching trenches in the monolithic medium 10 and serve to further inhibit gain in the passive/lossy regions 14. A cover plate 120 may be diffusion bonded to the monolithic medium 10 in order to cover the etched trenches 30 to thereby confine the cooling fluid to channels 30. It would be undesirable for the cooling fluid to contact the faces of the gain regions 12.

The formation of the trenches 30 damages the passive/lossy regions 14 and thereby inhibits gain and scatters any residual light that might be in those regions out of the media 10.

Figure 4A:
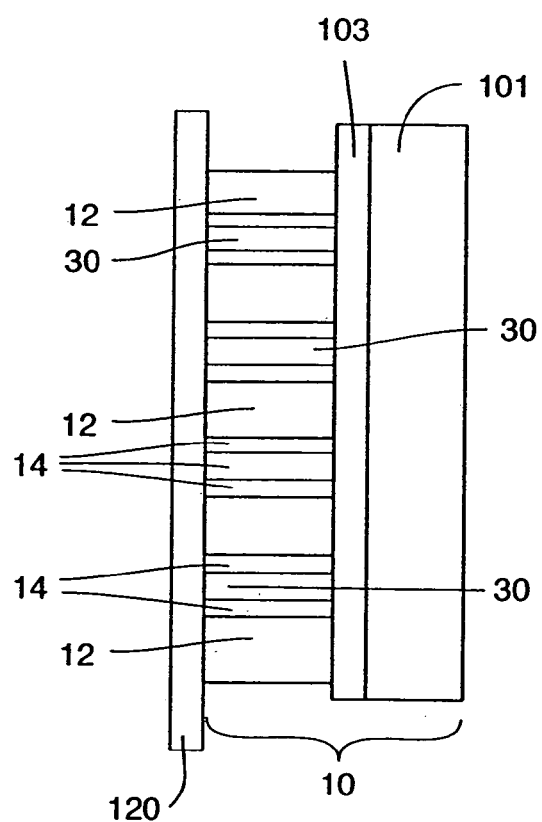
FIG. 4a is a section view through the embodiment of FIG. 4.
Figure 5:
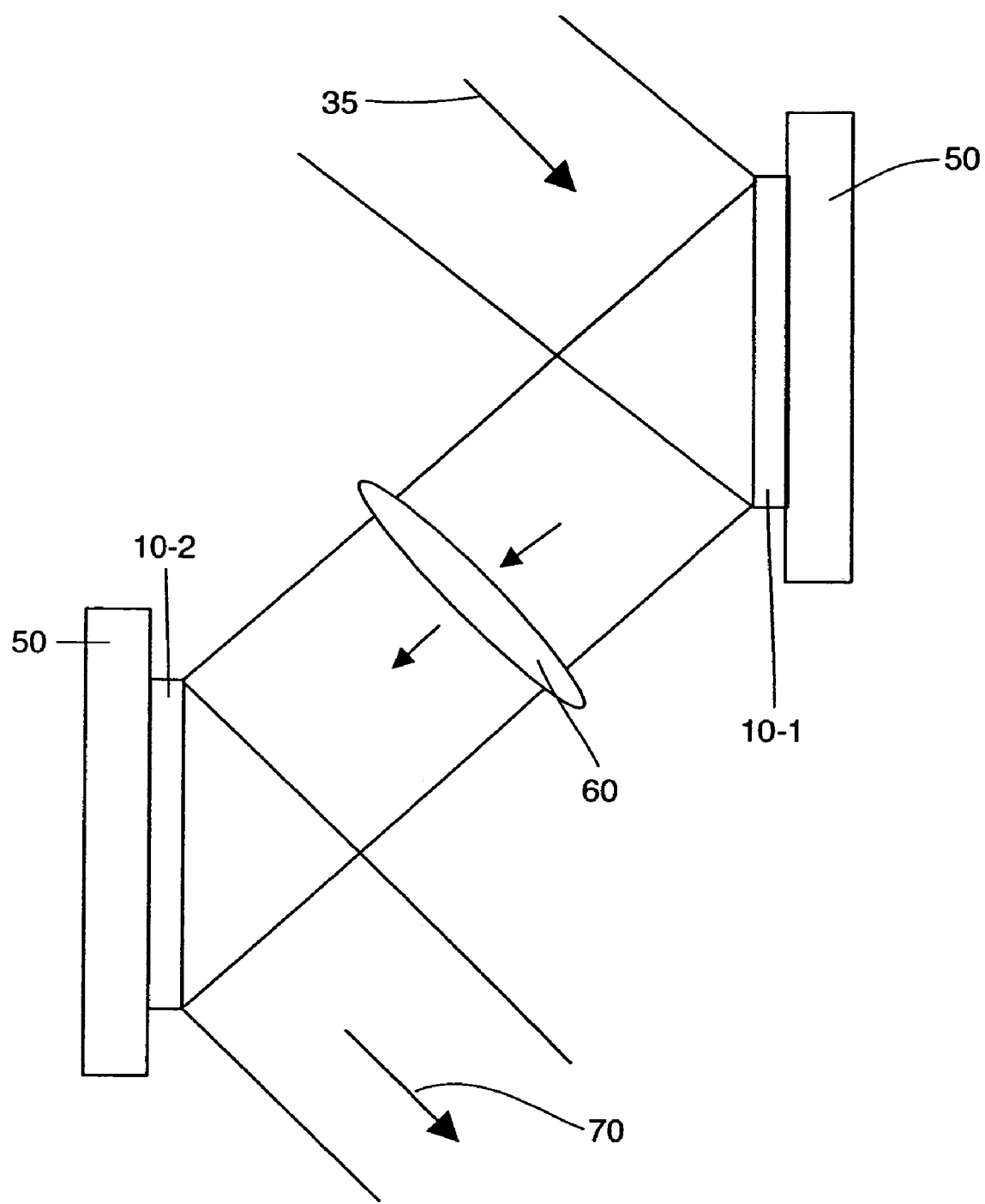
FIG. 5 is an illustration of the basic architecture of an electrically pumped active mirror system, using angular decoupling of the input and the amplified output signal beams, each mirror element with partitioned gain regions.

FIG. 5 illustrates the basic architecture of an electrically pumped active mirror system using angular decoupling of an input signal beam 35 and an amplified output signal beam 70, with electrical pumping via electrical current through wires 20, 21. The two partitioned monolithic gain elements 10-1 and 10-2 may have the cross-sectional view as shown in FIGS. 3a, 3b or FIG. 4a, and fabricated via the techniques described above for a monolithic gain element used in an electrically pumped system. In an electrically pumped system, the active mirrors are pumped via current injection paths 20, 21 (see FIG. 2) as opposed to by optical beams.

The partitioned monolithic medium element 10 of this invention is preferably a thin amplifying gain medium, e.g. a disk having a thickness of perhaps 1 to 10 μm, but it is conceivable that a media 10 of different physical shape or thickness could be used instead. Each partitioned monolithic element 10 is preferably mounted onto a thermally conducting element, represented herein by heat sinks 50, to remove excess heat. Power supply connections and other support hardware typically used with the gain medium elements 10-1 and 10-2 are well known in the art and are not presented herein.

If there is more than one amplifier, as is shown in FIG. 5, an image relay system 60 with gain-medium imaging elements can be used for spatial mapping of gain regions 12 of one monolithic gain medium element 10-1 onto the gain regions 12 of the subsequent gain medium element 10-2.

FIG. 5 provides just one example of a variety of laser or optical amplifier systems in which this invention can be utilized. Other examples of this can be found in FIGS. 3-9 in the U.S. Pat. No. 5,926,494 by D. M. Pepper, herein incorporated by reference. In order to most effectively utilize more than one of these partitioned monolithic gain mediums, the system can incorporate gain-medium imaging elements to relay the amplified signal beam profile onto subsequent gain modules, intracavity phase-corrector plates, and/or phase-conjugate MOPA system. In effect this invention can replace any gain medium in any optical system comprising of an active mirror, with the suggestion that for cascaded gain medium elements a method for imaging the signal beam pattern from one disk to another, such as the image relay system 60 in FIG. 5, be included for optimal performance.

The monolithic medium 10 is described as preferably being a layer of GaAs herein. Those skilled in the art will realize that a wide variety of material(s) or material composites or alloys, including quantum well structures or superlattice structures, may be used instead. Since these materials (and material systems) are well known to those skilled in the art of semiconductor lasers, they will not be further described herein.

Having described the invention in connection with a preferred embodiment therefore, modification will now certainly suggest itself to those skilled in the art. As such, the invention is not to be limited to the disclosed embodiments except as required by the appended claims.

What is claimed is:

1. A gain medium comprising:
   a substrate;
   a reflecting layer disposed on said substrate; and
   a layer of material disposed on said reflecting layer and comprising a plurality of gain regions and a passive/lossy region or regions, said gain regions being responsive, in use, to electric fields, in order to produce gain in the gain regions relative to the passive/lossy region or regions.

2. The gain medium of claim 1 wherein said plurality of gain regions are defined by a plurality of annular-like electrically conductive members disposed adjacent the layer of material.

3. The gain medium of claim 2 wherein said reflecting layer is segmented into a set of regions which have essentially the same shape and size as said annular-like electrically conductive members and being centered on respective ones of said annular-like electrically conductive members.

4. The gain medium of claim 2 wherein said plurality of annular-like electrically conductive members are each covered by an optically transparent, but electrically conductive cover.

5. The gain medium of claim 1, wherein said layer of material comprises GaAs.

6. The gain medium of claim 2, wherein said annular-like electrically conductive members are each circularly shaped.

7. The gain medium of claim 2 wherein said annular-like electrically conductive members are interconnected electrically with one another by a conductive ribbon which follows a serpentine path between adjacent ones of said annular-like electrically conductive members.

8. The gain medium of claim 1, further including cooling channels in said passive/lossy regions or regions for conducting heat generated therein away from the gain medium.

9. The gain medium of claim 1 wherein the gain regions are differently doped relative to the passive/lossy region or regions.

10. The gain medium of claim 1 wherein the passive/lossy region or regions are optically damaged.

11. The gain medium of claim 1 wherein the passive/lossy region or regions are trenched.

12. A method of minimizing the potential for parasitic oscillation modes and amplified spontaneous emissions, comprising the following steps:
    fabricating a monolithic gain element;
    partitioning said monolithic gain element into a plurality of gain regions and at least one passive/lossy region; and
    subjecting the gain element, in use, to electric fields, in order produce gain in the gain regions relative to at least one passive/lossy region.

13. The method of claim 12 wherein said step of partitioning further comprises doping to form gain regions.

14. The method of claim 12 wherein said step of partitioning further comprises doping said at least one passive/lossy region.

15. The method of claim 12 wherein said step of partitioning further comprises optically damaging said at least one passive/lossy region.

16. The method of claim 12 wherein said step of partitioning further comprises trenching said at least one passive/lossy region.

17. The method of claim 12, wherein said monolithic gain element comprises GaAs.

18. A laser system, comprising:
    an input optical signal beam;

at least one pumping source; and at least one monolithic gain element partitioned into gain regions and at least one passive/lossy region, said gain element being pumped by said at least one pumping source in order to amplify said input optical signal beam to produce an amplified output optical signal beam, the monolithic gain element having a substrate, a reflecting layer disposed on said substrate, and a layer of lasing material partitioned into said gain regions and said at least one passive/lossy region, said plurality of gain regions being differently electrically pumped relative to said at least one passive/lossy region.

19. The laser system of claim 18 wherein said gain regions are doped regions.

20. The laser system of claim 18 wherein said lossy regions are optically damaged regions.

21. The laser system of claim 18 wherein the gain regions are differently doped relative to the at least one passive/lossy region.

22. The laser system of claim 18 wherein the passive/lossy region or regions are trenched.

23. The laser system of claim 18, wherein said monolithic gain element comprises GaAs.

24. A laser system comprising:
an input signal beam;
at least one pumping source;
a plurality of monolithic gain medium elements having a plane, fabricated to provide a passive/lossy configuration to minimize modes of operation that are substantially within the plane, while maintaining a high-gain path for a mode of operation that is substantially normal to the plane; and a plurality of amplifier stages, each of the amplifier stages comprising at least one of said plurality of monolithic gain medium elements, a subsequent amplifier stage comprising at least another one second said monolithic gain medium elements, and each of said plurality of monolithic gain medium elements being adapted to receive the input signal beam, being electrically pumped by said at least one pumping source, and being partitioned into gain regions and passive/lossy regions in order to amplify said input signal beam to produce the amplified output signal beam.

25. The laser system of claim 24, wherein said monolithic gain elements comprise GaAs.

26. The laser system of claim 24 wherein said gain regions are doped regions.

27. The laser system of claim 24 wherein said lossy regions include trenches.

28. The laser system of claim 24 wherein said lossy regions are optically damaged regions.

* * * * *